United States Patent [19]
Hunton

[11] Patent Number: 5,955,916
[45] Date of Patent: Sep. 21, 1999

[54] MODULATOR LINEAR FEED-FORWARD AMPLIFIER

[75] Inventor: Matthew James Hunton, Pickerington, Ohio

[73] Assignee: Lucent Technologies Inc., Murray Hill, N.J.

[21] Appl. No.: 08/531,539

[22] Filed: Sep. 1, 1995

Related U.S. Application Data

[63] Continuation-in-part of application No. 08/344,439, Nov. 23, 1994, abandoned.

[51] Int. Cl.[6] .............................. H03F 1/32; G01R 31/26
[52] U.S. Cl. ............................. 330/2; 324/765; 330/151; 361/790
[58] Field of Search ............................ 330/2, 149, 151, 330/65, 66; 324/73.1, 765; 29/854; 361/735, 785, 790

[56] References Cited

U.S. PATENT DOCUMENTS

| | | | |
|---|---|---|---|
| 3,466,564 | 9/1969 | Weischedel | 330/66 |
| 4,612,512 | 9/1986 | Powell et al. | 330/151 X |
| 4,625,178 | 11/1986 | Mannerstrom | 330/68 X |
| 5,065,110 | 11/1991 | Ludvik et al. | 330/151 X |
| 5,128,628 | 7/1992 | Marks et al. | 330/66 |
| 5,304,945 | 4/1994 | Myer | 330/151 X |

*Primary Examiner*—James B. Mullins

[57] ABSTRACT

The invention concerns feed-forward, linear, radio-frequency amplifiers, which contain components which can be grouped into two categories: active and passive. Under the invention, all active components are constructed as two-port devices, which are easily tested, using standard equipment, in order to locate malfunctions. The active components plug into a network of the passive components, comprising striplines, waveguides, coaxial cables, and the like.

4 Claims, 15 Drawing Sheets

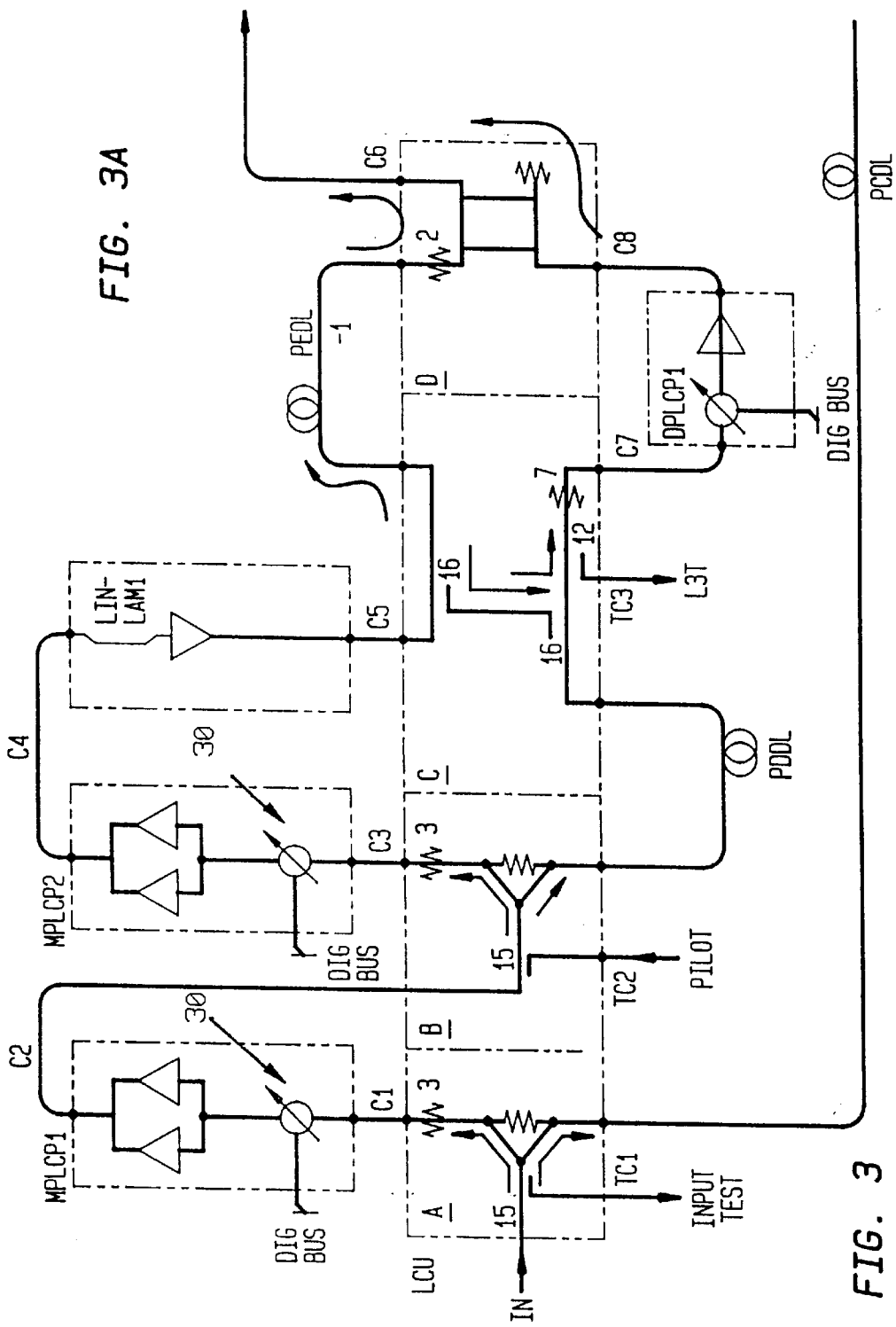

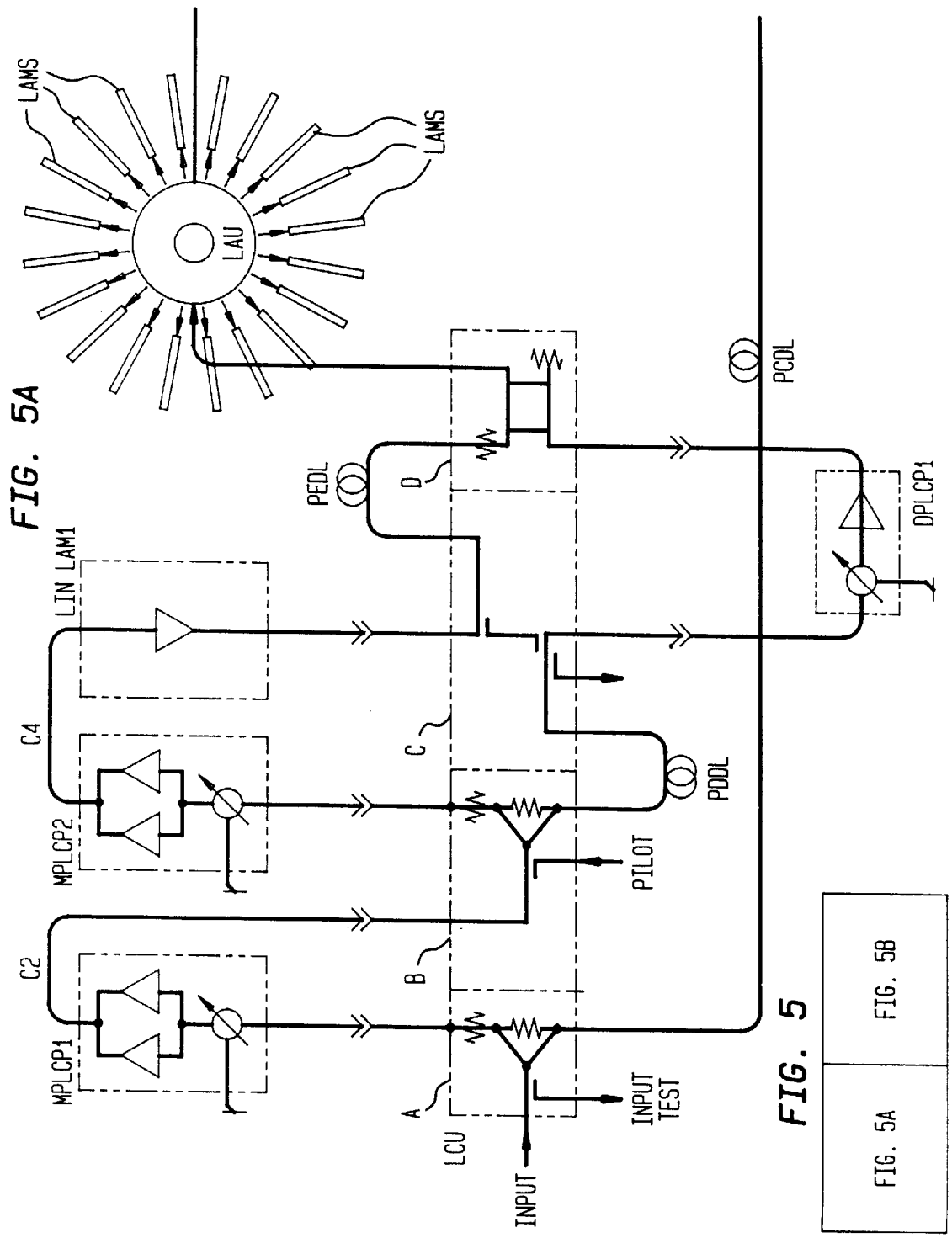

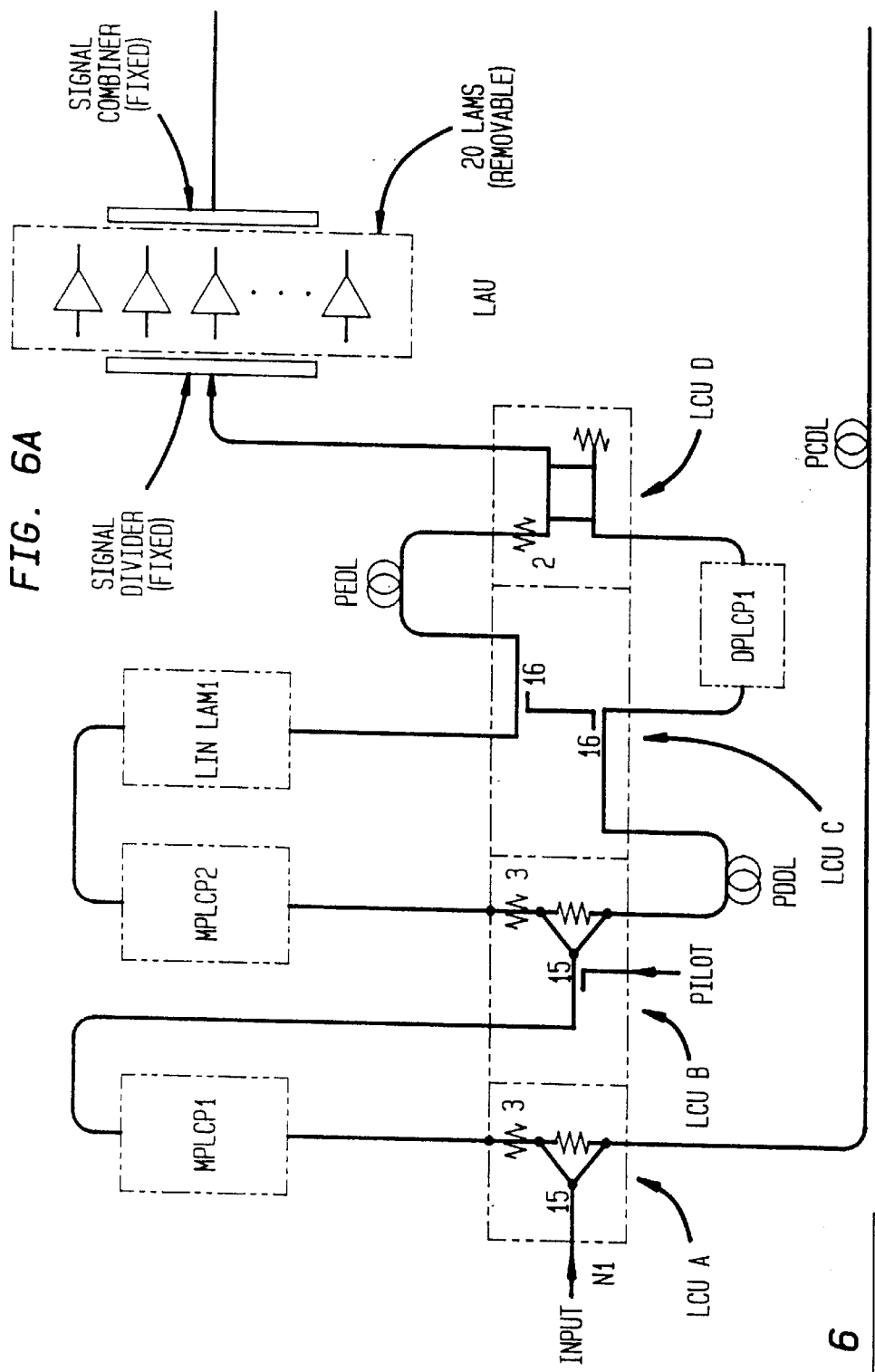

| FIG. 7A |
|---------|
| FIG. 7B |

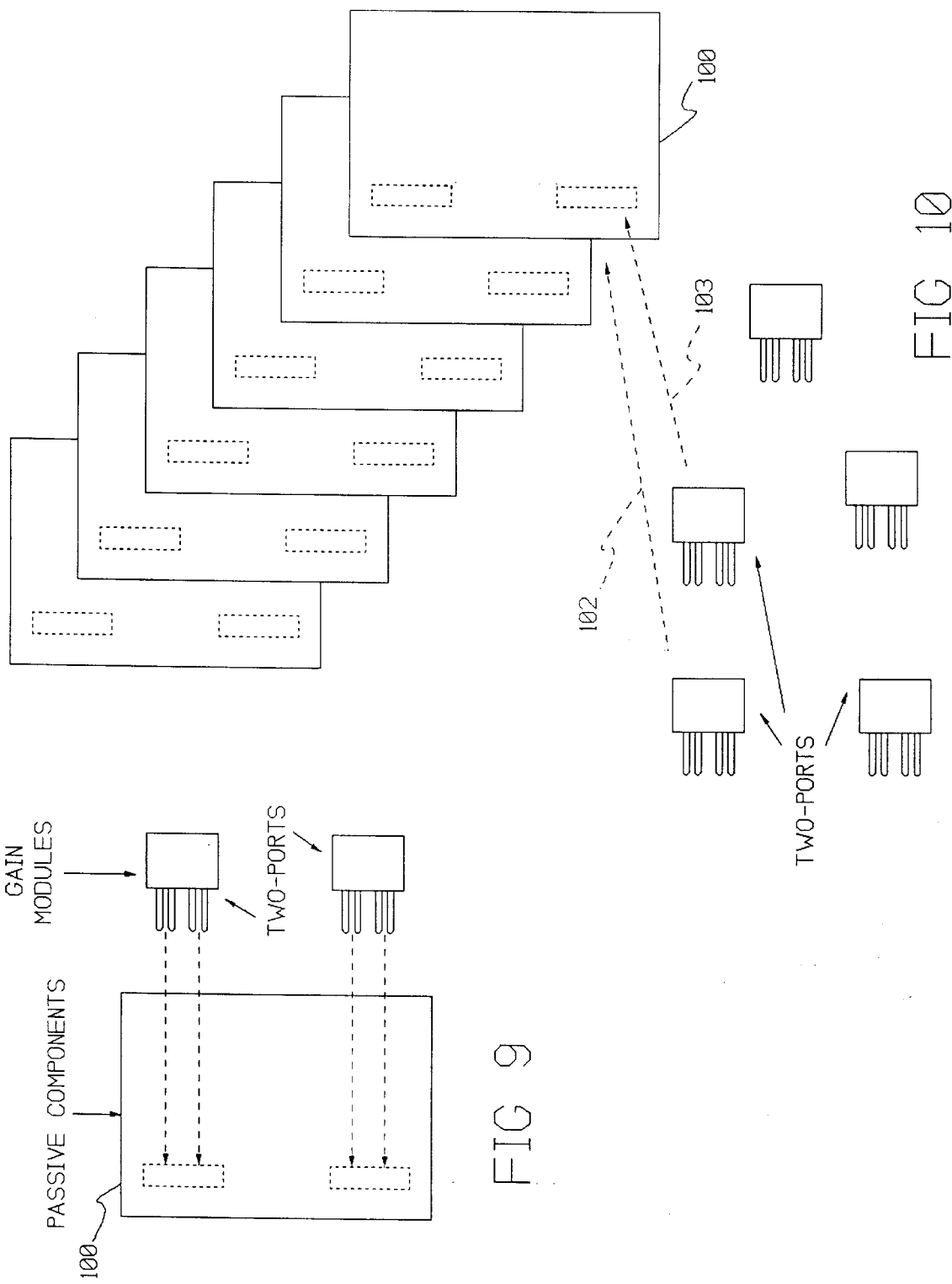

MODULATOR LINEAR FEED-FORWARD AMPLIFIER

This is a continuation-in-part of Ser. No. 08/344,439, filed on Nov.23, 1994, now abandoned.

The invention concerns feed-forward, radio-frequency (rf) amplifiers, in which the active components are constructed of two-port modules, which remove easily, and which, being two-ports, are simple to test, using s-parameters.

BACKGROUND OF THE INVENTION

FIG. 1 illustrates a commercially available feed-forward radio-frequency amplifier. The amplifier is constructed in sections, indicated by dashed boxes, such as 3, 6, 9, and 12. When a section malfunctions, the symptoms manifest as faulty operation of the amplifier as a whole. To isolate the malfunction, a technician generally removes the individual sections from the amplifier, and tests each one.

Testing each section is not a simple task, because some of the sections are actually multi-port networks. For example, section 3 contains ports 15, 18, 21, and 24. For testing, the technician generally connects impedances to some ports of the section, but leaves two ports open. These impedances intend to (a) simulates the impedances seen by the section when installed in the amplifier and (b) create a pseudo-two-port device to test, using the unconnected two ports.

However, this simulation is an inexact procedure, and does not always replicate the actual impedances seen by the section. Thus, the section is frequently tested in an environment different from its operating environment. This difference can make diagnosis difficult.

In addition, because of the complexity of this testing procedure, it is generally done at a manufacturing site, rather than in the field at the site where the amplifier is located. Consequently, the testing requires shipping of components to the manufacturing site, which imposes added cost.

SUMMARY OF THE INVENTION

In one form of the invention, the components of a feed-forward linear amplifier are grouped into two categories, active and passive. The passive components are highly reliable, and act as interconnections among the active components, which are all constructed as removable two-port networks, which are simple to test and maintain. Testing and maintenance can be done on-site, where the amplifier operates.

BRIEF DESCRIPTION OF THE DRAWINGS

FIGS. 3A and 3B are circuit diagrams of one form of the invention. The signal flow diagram of FIG. 2 is based on FIGS. 3A and 3B.

FIGS. 5A and 5B illustrate a problem which the digital bus of FIG. 4 mitigates. FIGS. 5A and 5B are annotated, abbreviated versions of FIG. 3.

FIGS. 6A and 6B illustrate removability of active elements from the circuit of FIG. 3.

FIG. 9 illustrates how TWO-PORTs are connected to a circuit board 100, which contains passive components exclusively.

FIG. 10 illustrates one form of the invention, implemented at a location such as a manufacturing site, or a repair depot.

DETAILED DESCRIPTION OF THE INVENTION

Highly Simplified Overview

Figure 1A:
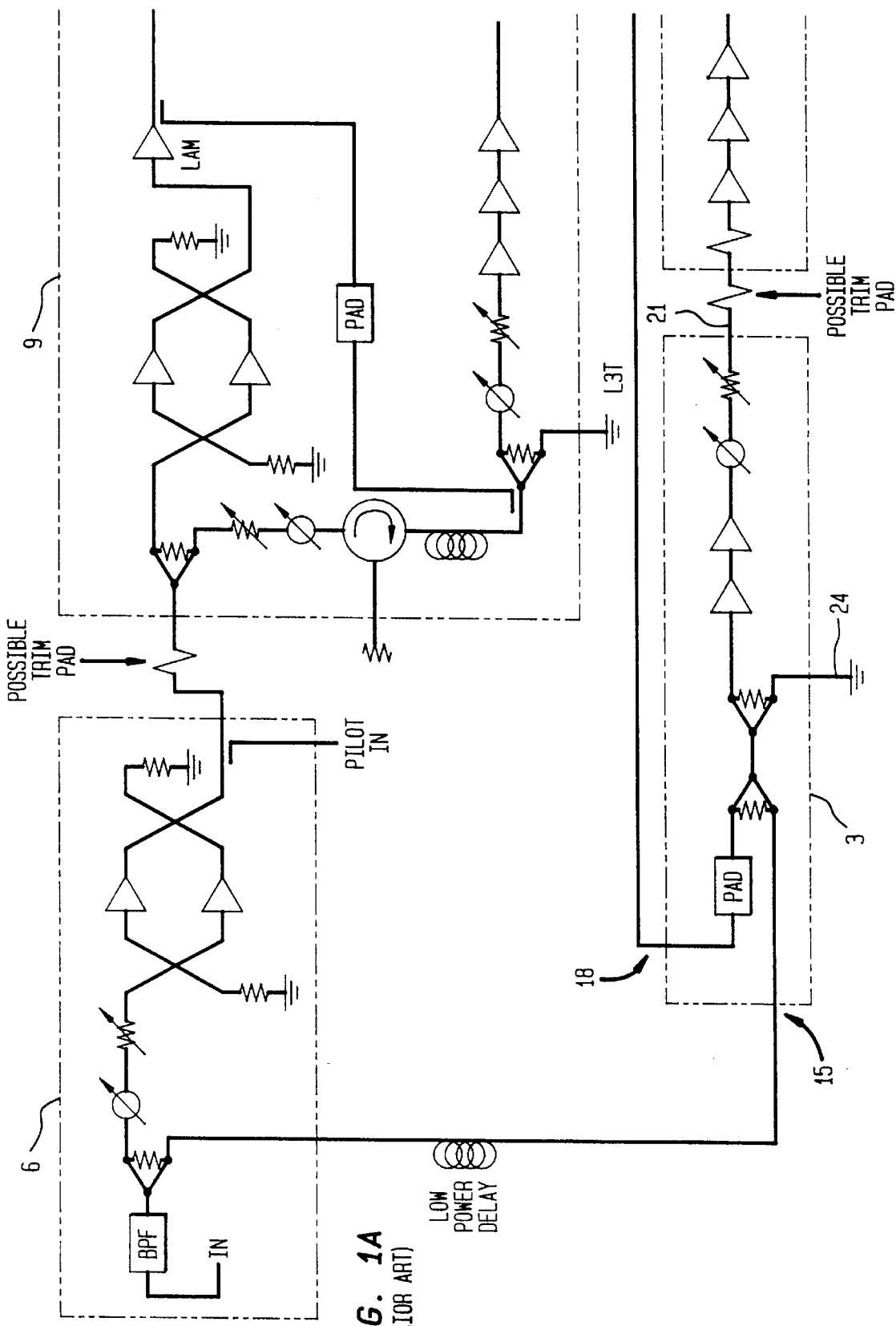
FIGS. 1A and 1B illustrate a commercially available feed-forward linear amplifier.
Figures 1, 1A, 1B:
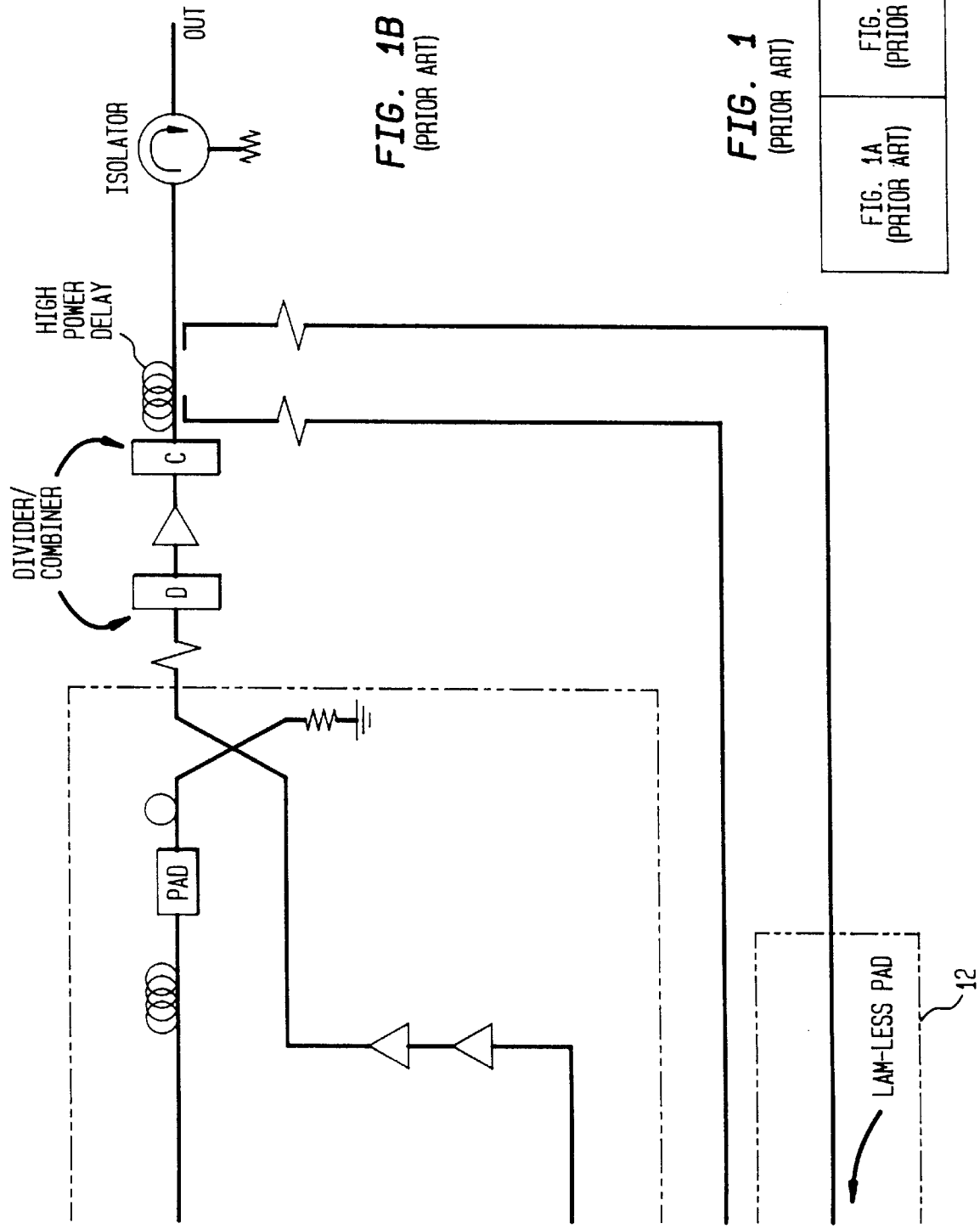
Figure 2:
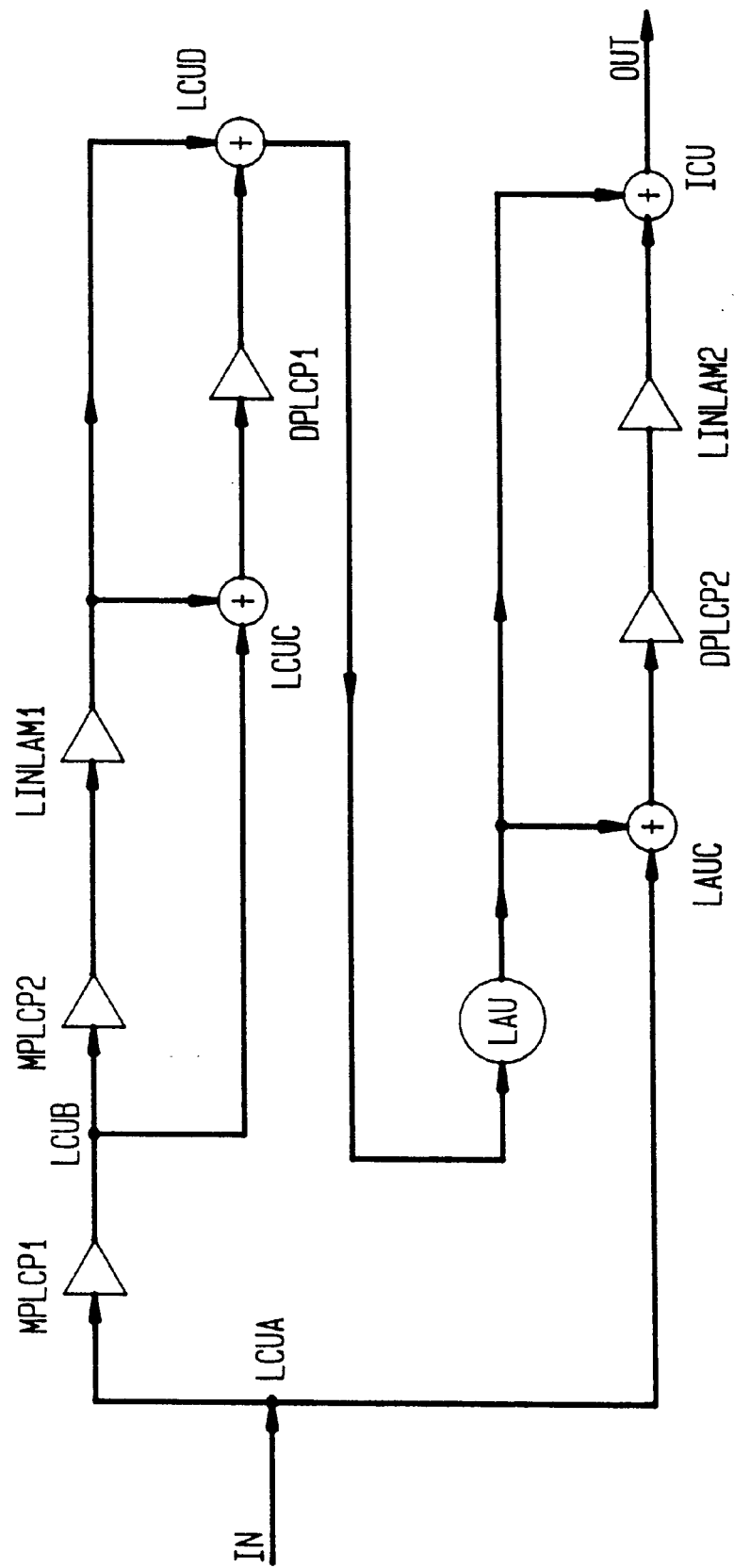
FIG. 2 is a signal flow diagram of one form of the invention.

FIG. 2 is a signal-flow diagram of one form of the invention. The active components (ie, those which consume power) are indicated as either triangles or circles. (They are explicitly listed in a later section.)

Figure 2A:
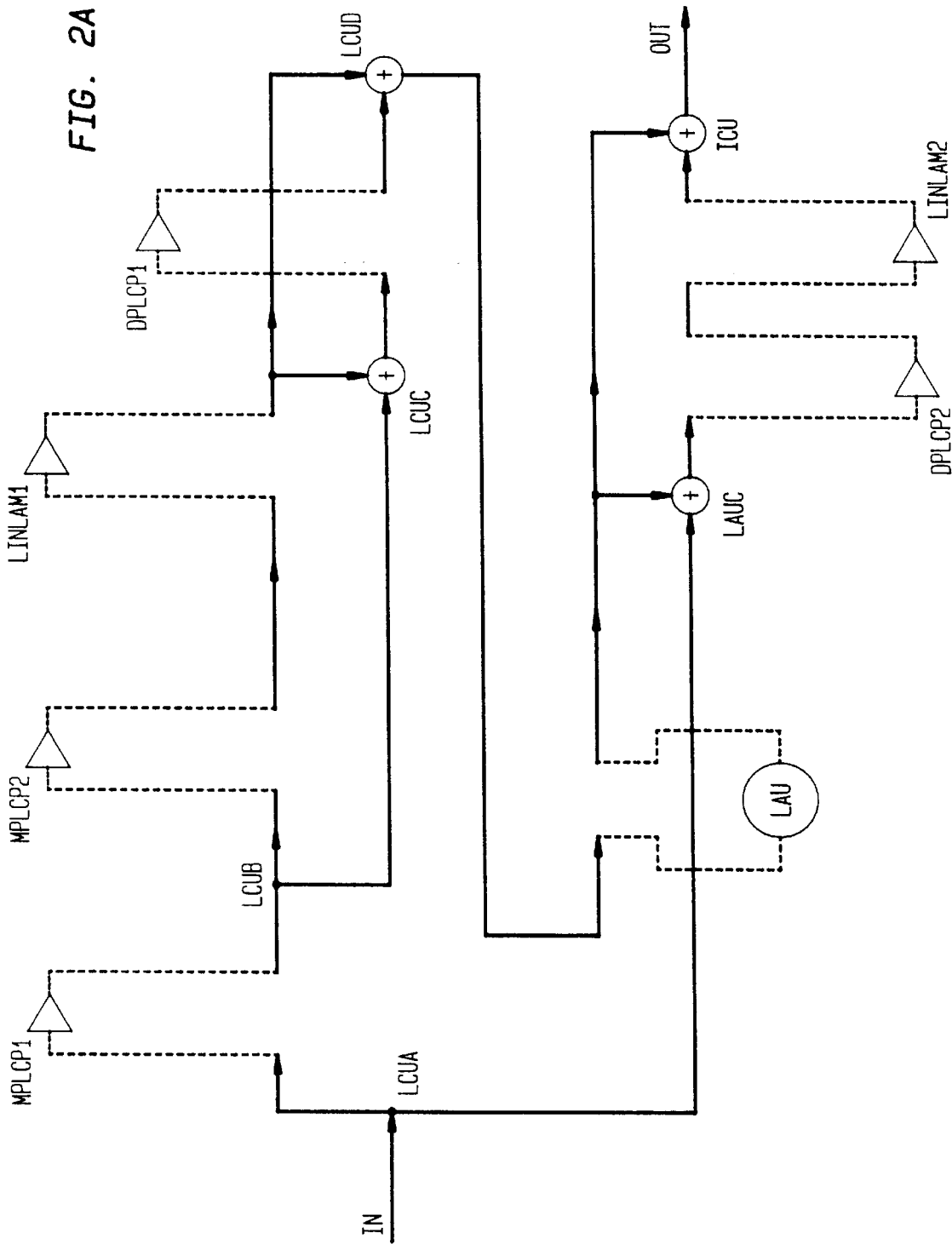
FIG. 2A illustrates removable active elements, which are two-ports.

These active components are removable, as indicated in FIG. 2A. Not only are they removable, but they are constructed as two-ports, as that term is used in network theory. That is, each component has an input (one port) and an output (the second port). No active component has additional ports, such as a feedback port.

Two-port networks can be tested in a straightforward manner, using commercially available equipment.

More Detailed Explanation

Figure 3B:
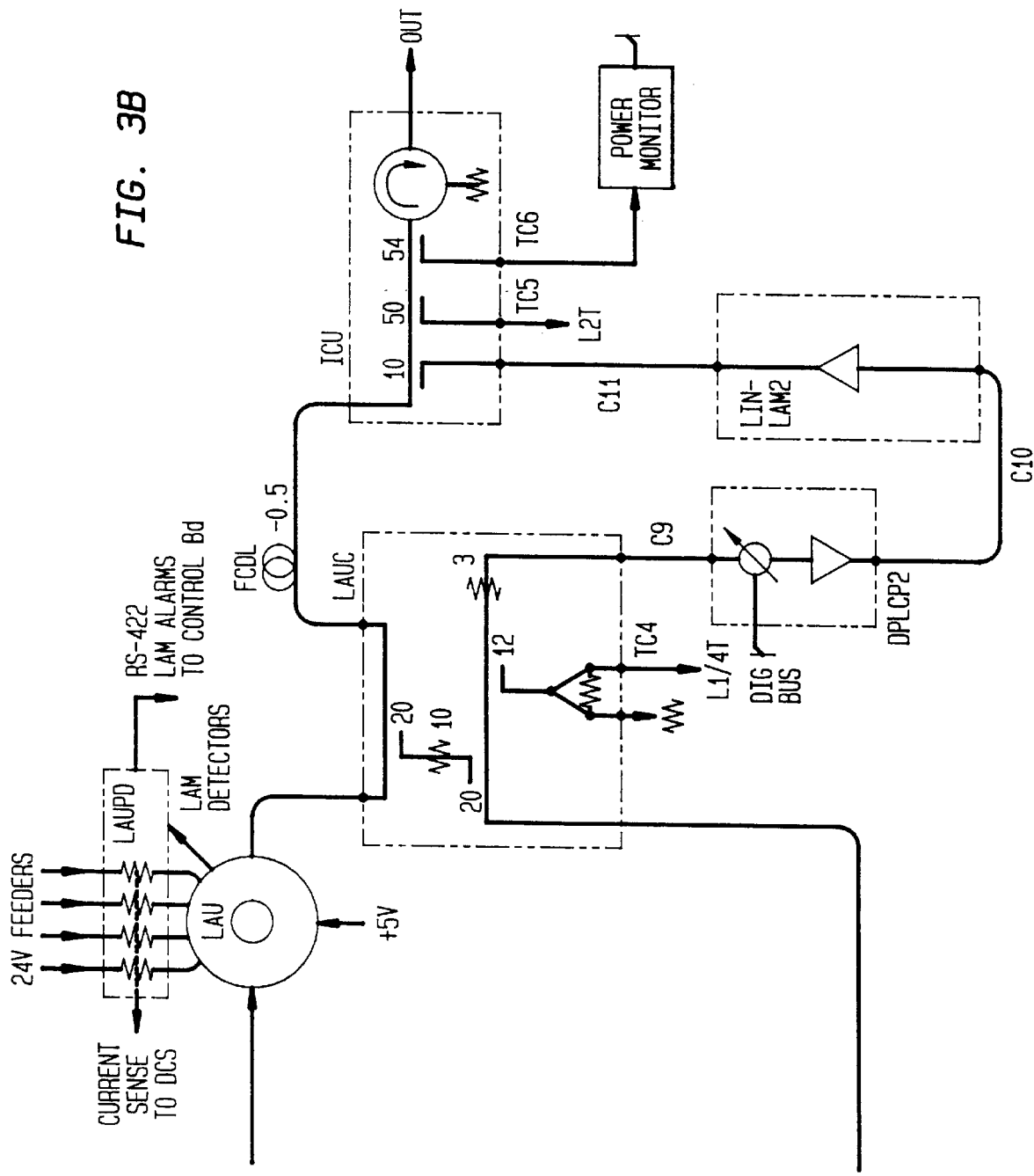

FIG. 3 is a circuit diagram which corresponds to FIG. 2. The symbols of FIG. 3 are explained as follows.

MPLCP1, MPLCP2 (Main Path Linear Control Packs #1 and #2): These are gain stages, producing gain in the range of 12 dB, and which are adjustable in gain and phase, as indicated by the arrow-circle symbol 30.

LIN-LAM 1, LIN-LAM 2 (Linear Amplifier Modules #1 and #2): These are power amplifiers, having nominal gains of 20.5 dB, and have distortion characteristics which match those of the LAU, discussed below.

LCU (Linearizer Coupler Unit): This is a power divider and combiner. It consists of four rf cavities, labeled A, B, C, and D. It can be viewed as a signal splitter and summer, performing the functions of components labeled LCU A, LCU B, and so on, in the signal flow graph of FIG. 2.

In the LCU of FIG. 3, signal flow is in the direction indicated by the arrows.

PEDL (Pre-Emphasis Delay Line), PDDL (Pre-Distortion Delay Line), PCDL (Post Correction Delay Line), FCDL (Final Correction Delay Line): these are delay lines for generating matching loop phase delays.

DPLCP1, DPLCP2 (Distortion Path Linear Control Packs #1 and #2): in the feed-forward linearization approach, distortion signals are isolated from the information signals. The DPLCP's provide controlled gain and phase adjustment to the isolated distortion signals. Gain is 43 dB, nominal, and is adjustable, together with phase being adjustable.

LAU (Linear Amplifier Unit): this is a power amplifier, which includes 20 individual rf amplifiers, in parallel. Gain is 19 dB, nominal. The individual rf amplifiers are sometimes called LAMs, or Linear Amplifier Modules.

LAUPD (Linear Amplifier Unit Power Distribution): this provides operating power to the LAU, and provides diagnostic functions, such as monitoring output power of the LAU.

LAUC (Linear Amplifier Unit Coupler): this isolates distortion signals generated by the LAU.

ICU (Isolator Coupler Unit): this combines the rf output of the LAU with the rf output of LINLAM2, to produce an output signal. It also contains two test ports, TC5 (Test Cable 5) and TC6. TC6 feeds a POWER MONITOR, which measures average power delivered. TC5 feeds L2T (Line 2 Test), which is discussed later.

C1, C2 (Cable 1, Cable 2), etc.: these are cables, waveguides, or striplines, as appropriate.

DIGITAL BUS: MPLCP1, MPLCP2, DPLCP1, and DPLCP2 receive a digital signal from a DIGITAL BUS. This digital signal feeds a digital-to-analog (D/A) converter, shown by example in FIG. 4, which converts the digital signal to an analog signal. The analog signal controls the gain and phase of these amplifiers. The gains and phases must be periodically adjusted, because these parameters are subject to drift, and also change with input signal loading.

Figure 4:
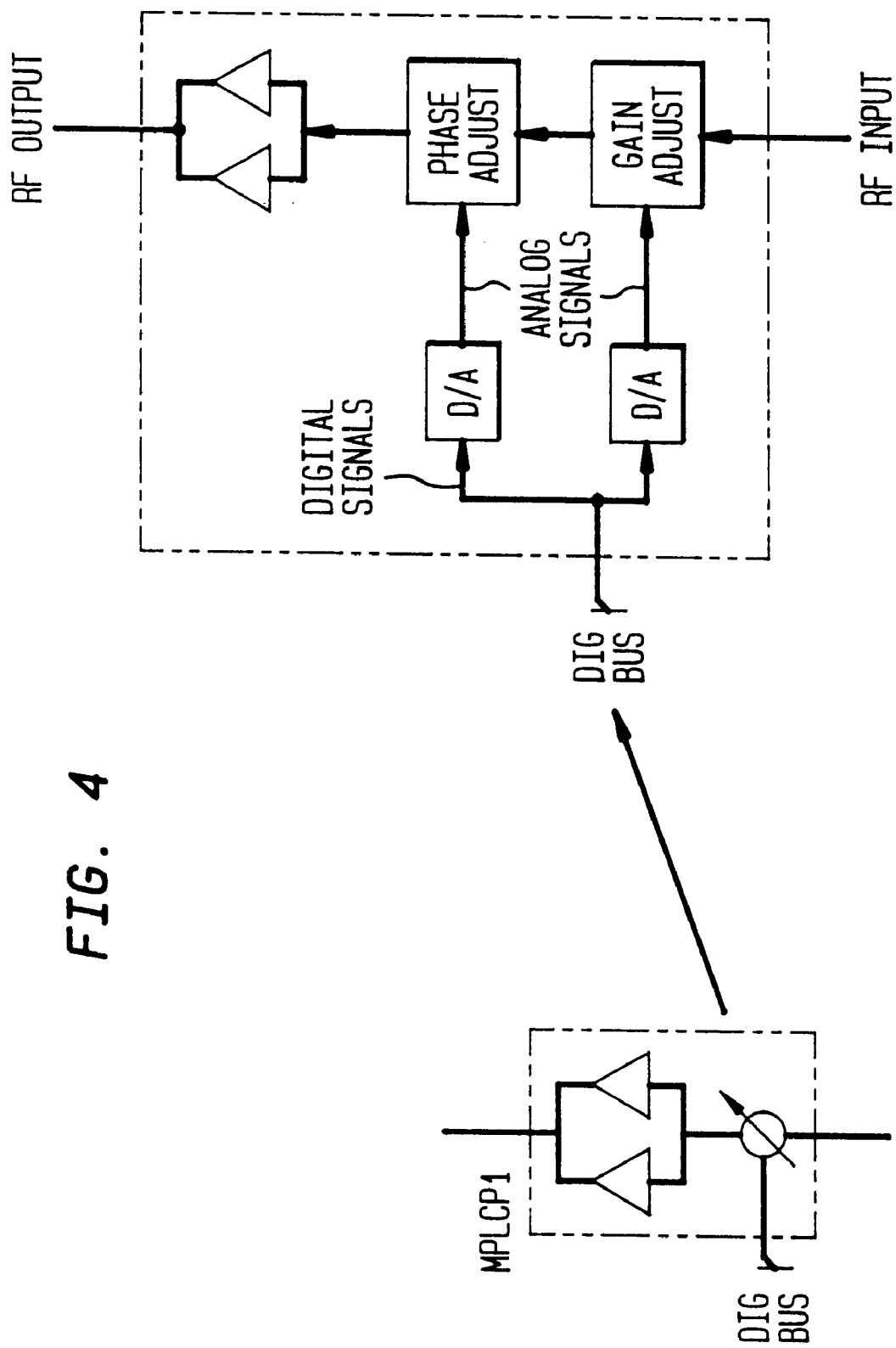
FIG. 4 illustrates use of a digital bus to transmit control signals to a gain stage.

FIG. 4 is illustrative only. Numerous different approaches can be taken to derive two analog signals (one-for gain, one for phase) from the digital signal on the digital bus. For example, if the digital signal contains 16 bits, the most significant 8 bits can be used to control gain, and the least significant 8 bits can be used to control phase. As another example, the gain/phase signals can be delivered in two steps, to two latches, one for gain and the other for phase.

The use of a digital signal has the advantage of eliminating ground loop problems. For example, if a control system measures a parameter, and, in response, applies an analog control signal to MPLCP1, then a feedback loop has been created. In general, such feedback loops are not favored.

The invention eliminates such loops, by transmitting a digital signal to the amplifiers. The digital signal path does not act as an analog transmission line, and does not create a feedback loop.

FIG. 3 contains all information required to construct the amplifier indicated.

Modular Aspects

Figure 5B:
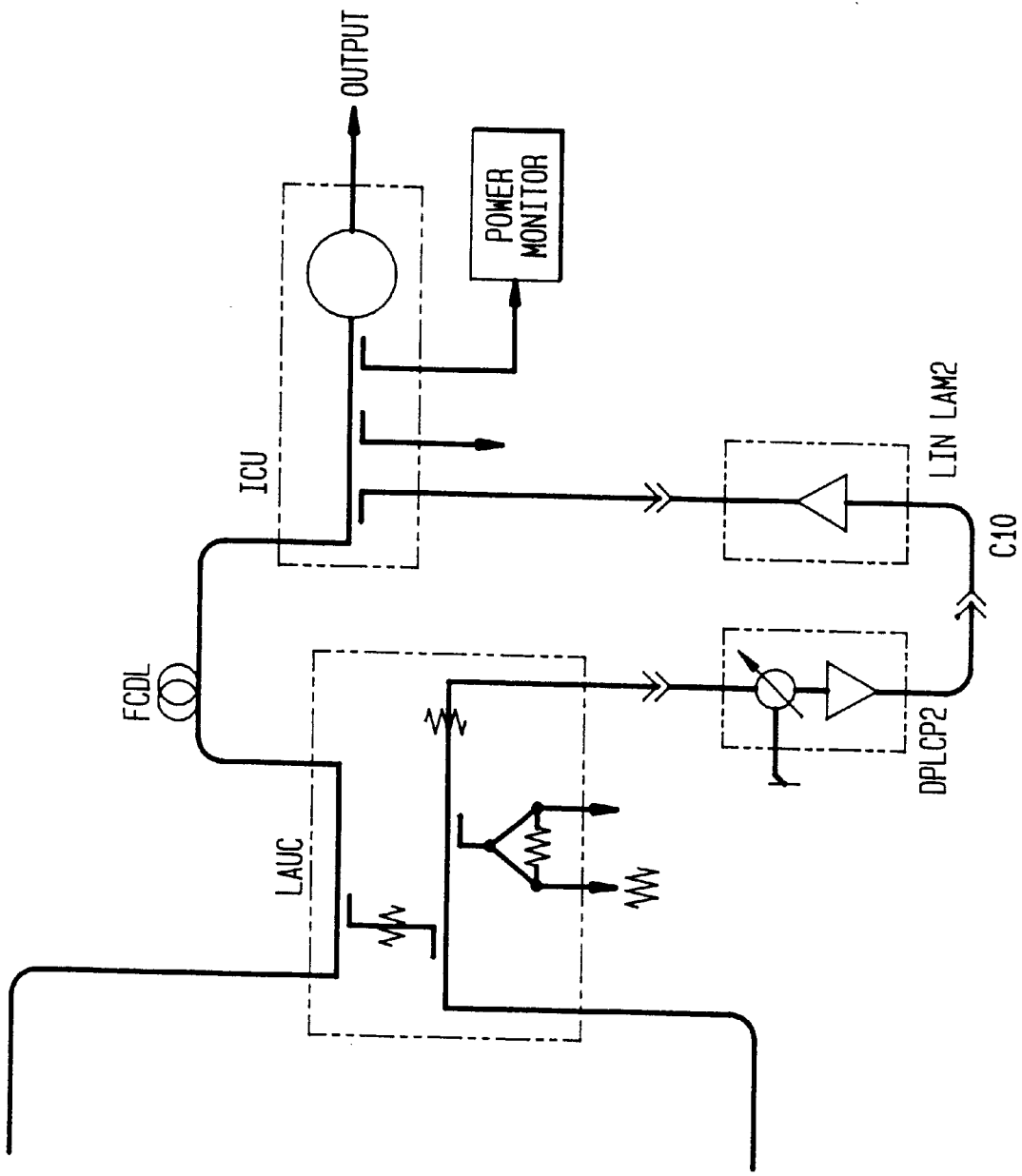

FIGS. 2A and 5 illustrate modular aspects of the invention. The components can be divided into two categories, active and passive:

Active Components

MPLCPs,

LIN-LAMs,

DPLCPs, and

LAMs.

This list refers to active components which process signals. Power supplies, of course, are also active components, but they do not process signals.

Passive Components

LCU (including A, B, C, and D),

PDDL,

PEDL,

PCDL,

FCDL,

LAUC,

ICU, and

Cables and interconnects.

The active components are disconnectable from the passive components, as indicated by the CONNECTORS in FIG. 5, which are standard blind mate connectors.

Further, as stated above, the active components are all constructed as two-port networks. For example, MPLCP1 contains an input port, at C1, and an output port, at C2. Two-port networks are easily diagnosed, using commercially available vector network analyzers, which analyze the s-parameter test set.

Benefits

In practice, if a malfunction occurs in the amplifier of FIG. 3, it is reasonable to assume that an active component is at fault, rather than a passive component, because of the high reliability of passive components. To isolate the malfunction, a technician removes the active components, one-at-a-time, and tests them, treating them as two-port networks. S-parameter testing is a common testing method. The testing will identify the faulty active component, which is then repaired or replaced.

Alternatively, the control board, discussed below, can be instructed to run a diagnostic program or routine, to isolate the fault.

Another Form of Invention

Figure 6B:
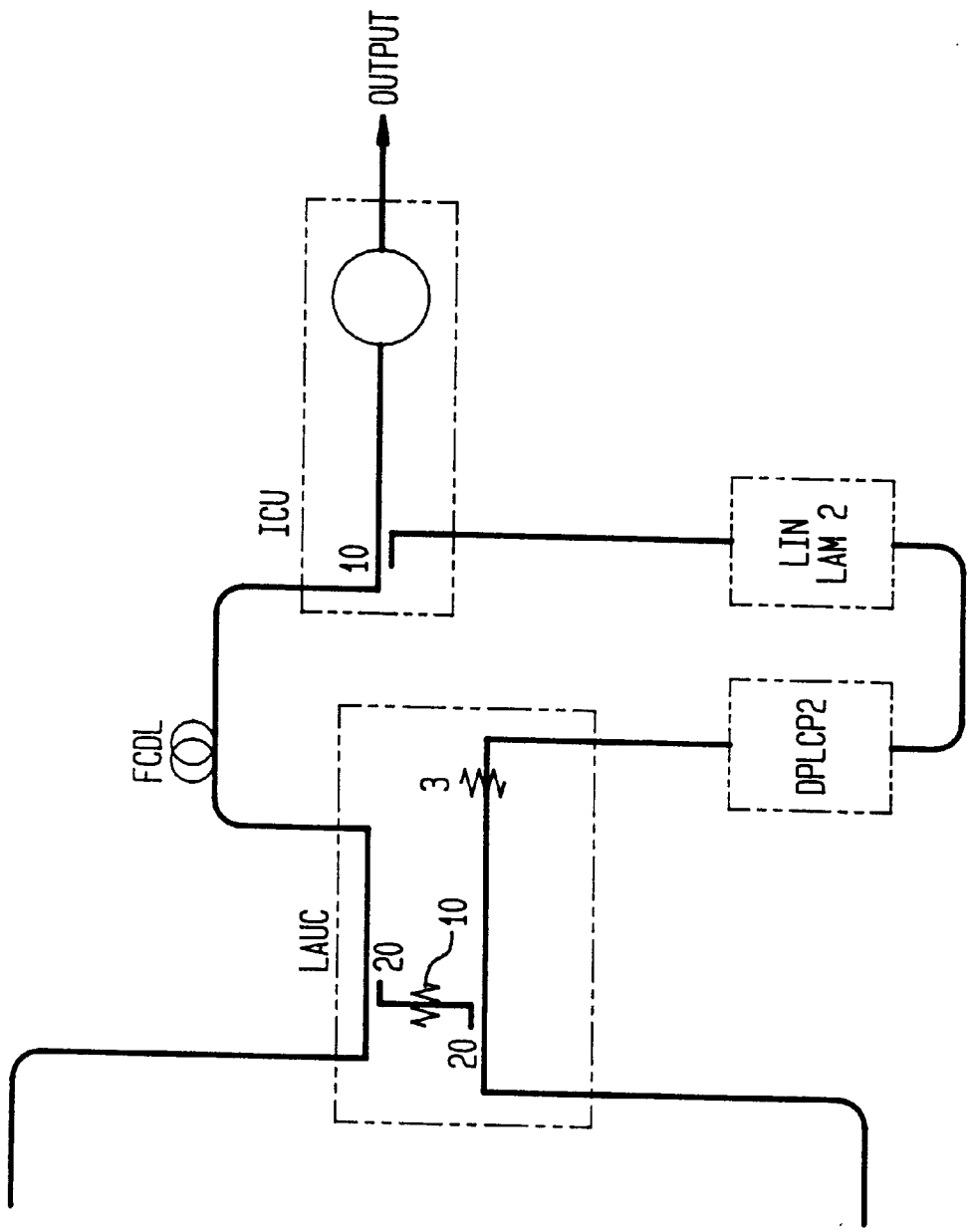

FIG. 6 is a modified form of FIG. 3. In FIG. 6, the active components have been deleted, and are represented by the dashed boxes. The invention of FIG. 6 is the passive network illustrated. Installation of the active components into the passive network produces a working amplifier.

Prior Patent

One type of feed-forward linear amplifier is discussed in U.S. Pat. 4,879,519, issued to Robert E. Myer on Nov. 7, 1989, and having a common assignee as the instant patent. This Myer patent is hereby incorporated by reference.

Significant Features

1. The amplifier of FIG. 3 is designed to operate in a frequency range of 869 to 894 MHz, and produce an average output power of 240 Watts (at the lead labeled OUT). All of the individual components of this Figure are commercially available.

Figure 8B:
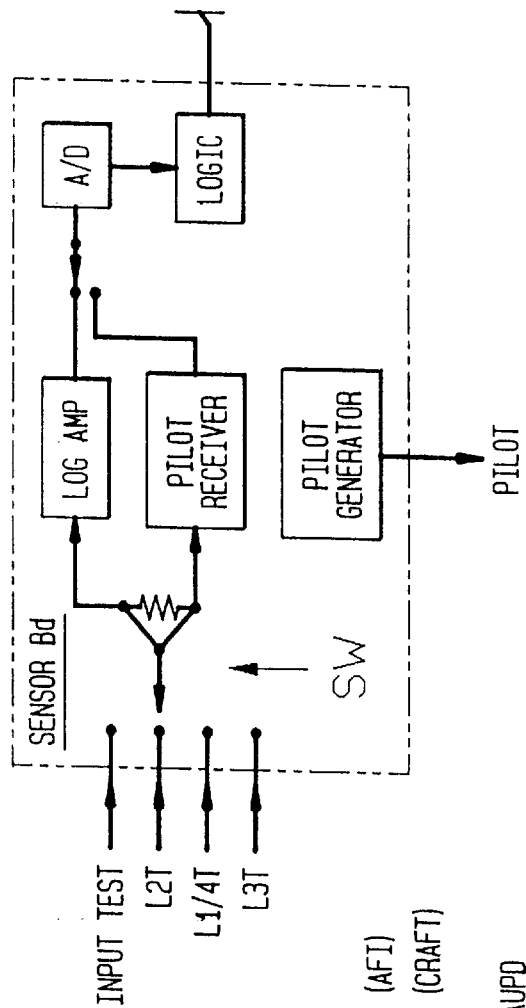
FIGS. 8A and 8B are modified forms of FIG. 3, with node numbers added.
Figure 8A:
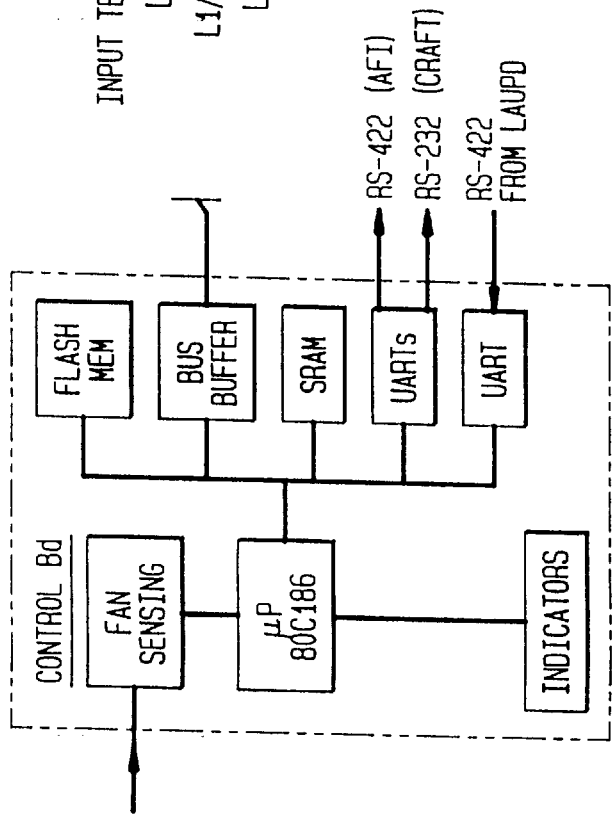

2. A CONTROL BD, in FIG. 8, orders a SENSOR BOARD to sense one of four lines (Input Test, L2T, L1/4T, and L3T, also shown in FIG. 3), by actuating a switch SW. If the CONTROL BD detects that the signal on the line tested is out-of-range, the CONTROL BD issues a proper digital signal, via its BUS BUFFER, to the DIGITAL BUS. The proper component (an MPLCP or a DPLCP) responds to this signal, and adjusts its gain and phase, or both, accordingly.

These gains and phases must be adjusted in order to provide proper signal cancellation and isolation of the distortion signal, as required by known principles of feed-forward linearization using pre-distortion correction and post-distortion correction.

3. MPLCP1 and MPLCP2 are physically identical. LIN-LAM1 and LIN-LAM2 are also identical. DPLCP1 and DPLCP2 are also physical identical. (The term "identical," is, of course, subject to manufacturing tolerances.) Since these components are identical, the types of active two-ports used by the invention of FIG. 3 are limited to four in number, namely, (1) the LAM, (2) the MPLCPs, (3) the LIN LAMs, and (4) the DPLCPs. (The LIN LAMs contain a LAM circuit board.)

The use of four types of active components produces a cost saving in terms of the inventory of parts which must be maintained, both in manufacturing and for repair.

4. The amplifier of FIG. 3 employs both pre-distortion correction and post-distortion correction.

Figures 7, 7A:
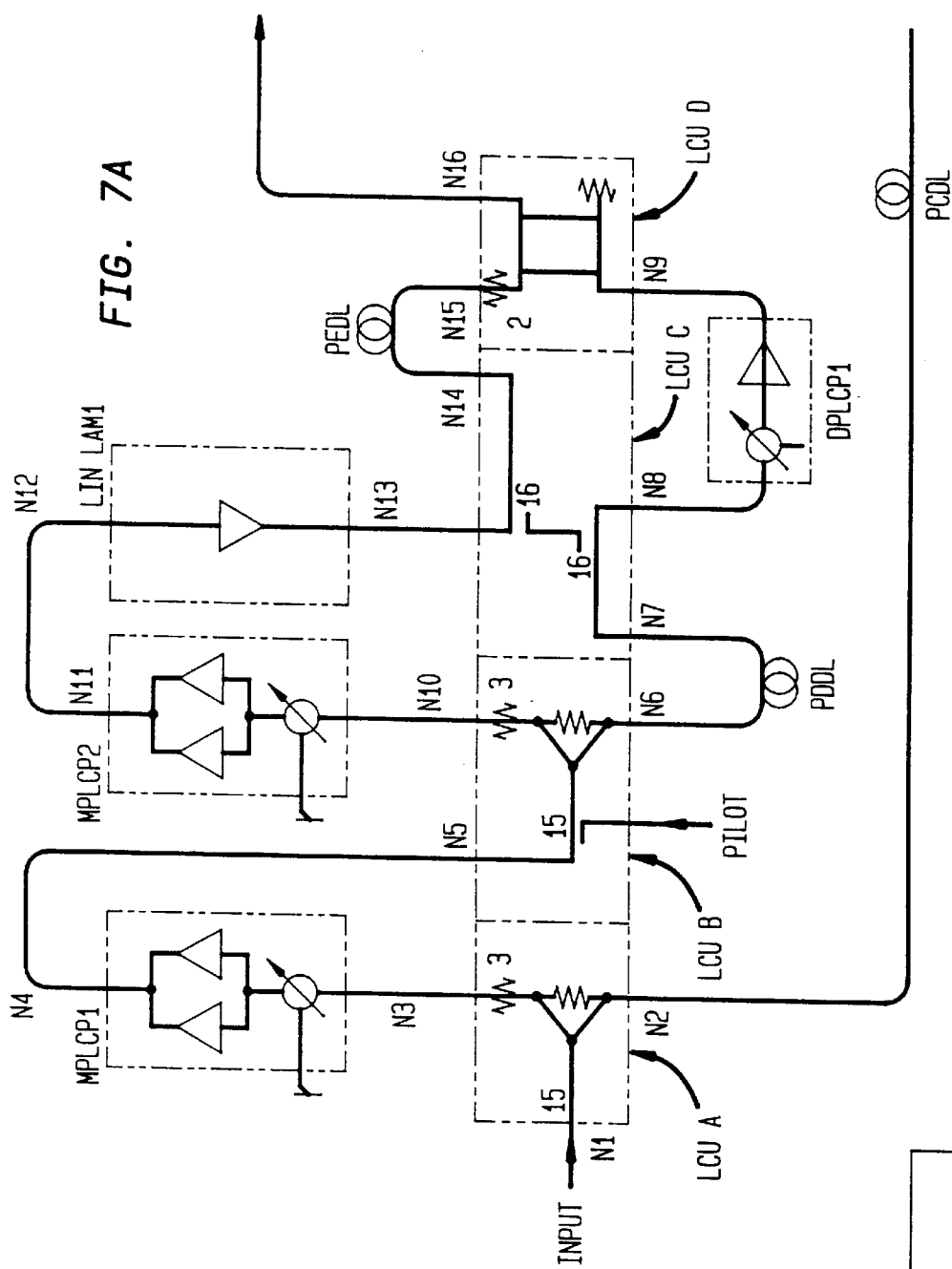
FIGS. 7A and 7B illustrate another form of the invention.
Figure 7B:
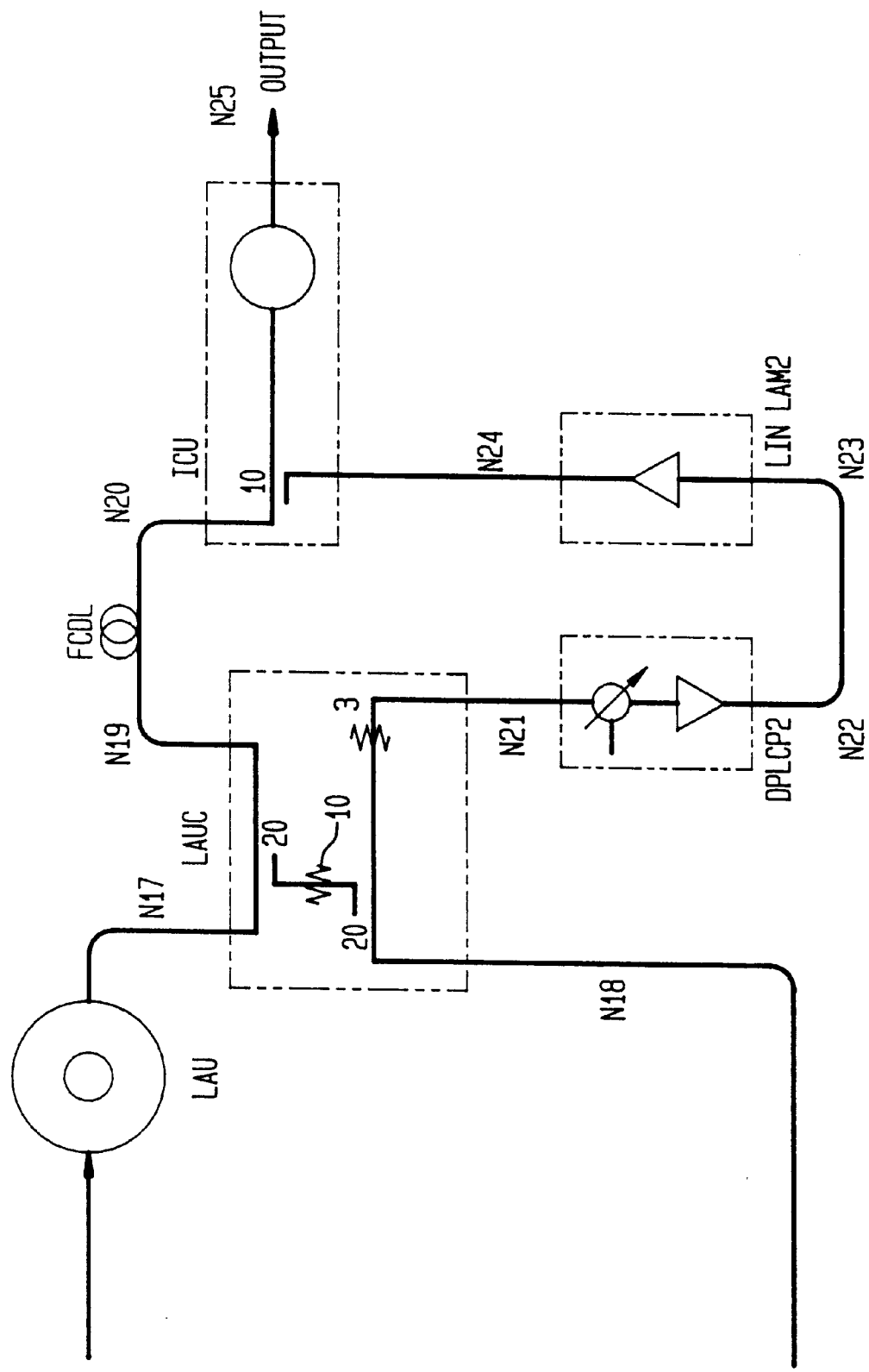

5. FIG. 7 resembles FIG. 5, but with node numbers added for reference. It should be noted that some nodes are connected by short cables, such as nodes 22 and 23. These nodes are very close in signal amplitude and phase, and can be treated as a single node. Nodes N11 and N12 provide another example.

6. Spring-Loaded Connectors. FIG. 5 shows removable gain stages, which are connected to passive components by connectors. The connectors are designed to facilitate easy insertion, and easy removal, of the gain stages. Consequently, no bonding agents are used, such as solder, brazing alloy, conductive epoxy, or the like. (Although anti-corrosion agents, or pastes, may be used.)

In general, the electrodes within the connectors are urged into contact by spring forces. In some types of connector, an actual spring can be used, which urges the electrodes together. In other types of connector, the electrodes themselves act as springs: deformation of the electrodes generates the spring forces. In yet other types of connector, the housings which support the electrodes, and which mate together, deform and supply the spring forces.

Therefore, one characteristic of the connectors is that a spring force biases electrodes into contact, without use of a bonding agent. These connectors can be called "spring-loaded," or "non-bonding," or both.

7. Fastening of connectors Together.

"Hand-Releasable" Connections

The connectors are "hand-engageable" and "hand-releasable." These terms refer to the fact that the forces needed for release and engagement of the connectors are supplied by the human hand. The hand may be assisted by tools, such as a wrench or screwdriver. Nevertheless, the forces applied in engaging or releasing the connectors are generated by the human hand. The tools assist in gripping fasteners, but the force which moves the tools is, again, supplied by the human hand.

"Engagement" refers to a usable, reliable electrical connection, in which connection is maintained in the face of normal forces present in the operating environment which tend to disrupt the connection.

Non-"Hand Releasable" Connections

Connectors in which engagement is attained by fusing a material, as in brazing, soldering, or welding, are not "hand releasable." For example, a wire may be soldered to a conductive trace located on a printed circuit board (PCB). The unassisted human hand may be able to extract the wire from the board, and thereby break the connection.

However, in such a case, one of three scenarios is likely:

1. The wire can remain soldered to the circuit trace. Pulling the wire dislodges the circuit trace from the board (the traces are attached to the boards by a hot-melt adhesive). The now-dislodged trace will probably break.

2. The wire can break.

3. The soldered joint can break.

Further, the break will probably occur at an unpredictable location.

This type of release is "destructive," in the sense that part of the hardware involved has been destroyed. This destroyed hardware must be reconstructed before another connection can be made again. Another ramification of the destruction is that, if a new connection is desired with a new wire, then the new connection cannot, in general, be achieved by merely positioning a new wire in the previous wire's place. One or more reasons dictate this conclusion.

1. Perhaps the most general reason is that, in PCBs, wires are generally inserted through holes, and then soldered to a nearby trace. When the old wire breaks, the hole most likely remains filled with frozen solder. The new wire cannot enter the hole and assume the old wire's position.

2. If the trace fractured, then the trace does not extend to the position of the old wire. Placing a new wire in that position does not result in electrical continuity (even ignoring the problem of the solder-filled hole).

3. If the old trace does continue to the position of the old wire, positioning the new wire in the old wire's place can result in a type of continuity. However, no agent exists to force the new wire into contact with the trace. Any continuity is sporadic at best. "Engagement" does not exist.

Thus, the preceding discussion illustrates that fused connections are not "hand releasable." A bonding material (eg, solder, brazing alloy, etc.) must be melted, which cannot be done by the human hand.

Therefore, one characterization of the connectors used by the invention is that they are hand-releasable and hand-engageable, without damage.

"Without damage" implies one or more of the following:

1. That the connectors retain their functionality upon disengagement.

2. That engagement, or disengagement, does not change the operative geometry of the connectors.

3. That, when connectors which are hand-releasable and hand-engageable undergo release, they remain hand-engageable.

4. That, for example, if connectors A and B are disconnected, then (a) connector A can be later mated with a connector C, which is identical to connector B, and (b) connector B can be later mated with a connector D, which is identical to connector A.

In contrast, breaking a soldered connection is not disconnection "without damage." The now-disconnected components are not "hand-engageable."

8. Self-Supporting Gain Modules. All tuning of the amplifier as-a-whole is done to the gain modules, such as the MPLCPs, LIN-LAMs, DPLCPs, and LAMs. (One possible exception is tuning of the adjustable component shown in the ICU in FIG. 3B. If that component, an isolator, is adjustable, then adjustment is done once, at the time of manufacture.)

From another point of view, the gain modules are TWO-PORTs, as indicated, in simplified form, in FIG. 9. Each has a defined performance, in terms of the S-parameter transfer matrix. They are tuned, as by adjusting gain and phase, to attain this transfer matrix, prior to connection to the passive components. Once they are connected to the passive components, no further tuning is required of any components, active or passive.

This approach facilitates assemble and troubleshooting. For example, FIG. 10 illustrates a multiplicity of the passive boards 100, and a plurality of gain modules, labeled TWO-PORTs. Once the TWO-PORTs are tuned so that the proper S-parameters are attained, any TWO-PORT can be inserted into its respective position in any randomly selected board 100, as indicated by arrows 102 and 103. Or a given TWO-PORT, once inserted, can be removed and replaced by another properly tuned TWO-PORT. In either case, the overall amplifier will function properly, without further tuning or adjustment.

9. Sequence of Assembly. In one approach, the GAIN and PHASE blocks shown in FIG. 4 are adjusted, while the two-port is connected to a vector network analyzer, in order to attain the desired S-parameter transfer matrix for the two port. Then, the two-port is connected to the passive components, shown in FIG. 5. No further tuning is required.

From another point of view, all passive-component boards (of the same design) have the same response characteristics. Once a two-port is tuned, it can be inserted into any passive-component board.

Therefore, the two-ports are complete, self-contained amplifiers which, when tuned, perform amplification with a specific gain and a specific phase. The gains and phases are specified by the S-parameter transfer matrix. The passive components on the board to which the two-ports are connected are designed to accept these two-ports. No tuning of the passive components is done, after assembly.

10. Access to Two-Ports. In the final amplifier, which may be enclosed in a housing and cooled by a cooling system, the two-ports shown in FIG. 4 remain accessible. No components involved in the essential function of the amplifier need be disassembled, in order to gain access to the two-ports. For example, no heat sinks need be removed to gain access to the two-ports.

From another point of view, the amplifier remains fully functional at the instant just prior to removal of a two-port. If heat sinks, or other essential components, must be removed prior to removing the two-ports, then the amplifier is not "fully functional" at the time of removal. In the case of a heat sink, its removal will cause the component which it cooled to fail shortly thereafter.

The amplifier may be contained within a housing, which contains an access hatch, which must be opened to reach the two-ports. In general, housings and access hatches are not considered "essential" components, since the amplifier can operate without them. Housings serve to prevent damage, and to protect from dust and moisture.

Numerous substitutions and modifications can be undertaken without departing from the true spirit and scope of the invention. What is desired to be secured by Letters Patent is the invention as defined in the following claims.

I claim:

1. A method of assembling a feed-forward amplifier, which includes pre-distortion or post-distortion correction, or both, comprising the following sequence of steps:
   a) tuning gain stages, in order to attain a predetermined S-parameter matrix for each;
   b) inserting the gain stages into a passive network, using connectors which are hand-engageable and hand-releasable, without damage to the connectors; and
   c) placing the amplifier into normal use, without further tuning.

2. A method of testing an amplifier, comprising the following steps:
   a) removing only one, or more, active two-port networks from the amplifier; and
   b) testing the active two-ports, based on an s-parameter test set, in order to identify faulty two-ports.

3. An assembly of components, from which a feed-forward amplifier can be assembled, comprising:
   a) a collection of substantially identical boards, each containing:
      i) passive components only; and
      ii) connectors for receiving two-port devices; and
   b) two-port gain stages which, when tuned to attain pre-defined S-parameter characteristics, will produce an operable amplifier, upon insertion into a randomly selected board.

4. Components according to claim 3, in which the connectors are hand-releasable and hand-engageable, without damage.

* * * * *